United States Patent
Miyamoto

(10) Patent No.: US 11,204,372 B2
(45) Date of Patent: Dec. 21, 2021

(54) CURRENT SENSOR

(71) Applicant: DENSO CORPORATION, Kariya (JP)

(72) Inventor: Ryo Miyamoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/001,810

(22) Filed: Aug. 25, 2020

(65) Prior Publication Data

US 2021/0063446 A1 Mar. 4, 2021

(30) Foreign Application Priority Data

Sep. 4, 2019 (JP) .............................. JP2019-161290

(51) Int. Cl.
*G01R 15/20* (2006.01)
*G01R 19/00* (2006.01)

(52) U.S. Cl.
CPC ......... *G01R 15/205* (2013.01); *G01R 15/202* (2013.01); *G01R 19/0092* (2013.01)

(58) Field of Classification Search
CPC ... H04L 7/0037; H04L 25/14; H04L 25/4917; H04L 7/033; H04L 7/0276; G06F 13/4273; G06F 13/4291

USPC ......................................................... 324/126
See application file for complete search history.

(56) References Cited

U.S. PATENT DOCUMENTS

| 2006/0027390 A1* | 2/2006 | Suzuki | H01R 9/226 174/68.2 |
| 2012/0062211 A1* | 3/2012 | Neal | G01R 11/04 324/127 |
| 2013/0320968 A1* | 12/2013 | Sakamoto | G01R 1/18 324/244 |
| 2017/0343584 A1 | 11/2017 | Abe | |
| 2019/0187187 A1* | 6/2019 | Umetsu | H01R 25/16 |
| 2019/0234996 A1* | 8/2019 | Nomura | G01R 19/0092 |

* cited by examiner

*Primary Examiner* — Tung X Nguyen
*Assistant Examiner* — Robert P Alejnikov, Jr.
(74) *Attorney, Agent, or Firm* — Posz Law Group, PLC

(57) ABSTRACT

A current sensor includes three bus bars, each of which has recesses. The third bus bar is between the first and second bus bars. The recesses of the first and second bus bars are symmetrical about a virtual line that passes through the center of the third bus bar. The third bus bar has two recesses that are symmetrical about the same virtual line.

6 Claims, 8 Drawing Sheets

US 11,204,372 B2

CURRENT SENSOR

CROSS REFERENCE TO RELATED APPLICATION

This application is based on Japanese Patent Application No. 2019-161290 filed on Sep. 4, 2019, the disclosure of which is incorporated herein by reference in its entirety

TECHNICAL FIELD

The present disclosure relates to a current sensor.

BACKGROUND

A current sensor is configured to detect an electric current flowing through three bus bars. Each of the bus bars is a wiring element having a liner shape elongated in a predetermined direction. The three bus bars are arranged in parallel with each other and three detectors configured to detect the electric current are disposed for the three bus bars.

SUMMARY

A current sensor includes a first bus bar, a second bus bar, a third bus bar, a first detecting element, a second detecting element, and a third detecting element.

Each of the first bus bar, the second bus bar, and the third bus bar is elongated in a predetermined direction and is disposed in parallel with each other in an arrangement direction. An alternating current flows through the first bus bar, the second bus bar, and the third bus bar. The first detecting element is configured to detect the alternating current flowing through the first bus bar. The second detecting element is configured to detect the alternating current flowing through the second bus bar. The third detecting element is configured to detect the alternating current flowing through the third bus bar.

The third bus bar is disposed between the first bus bar and the second bus bar. The first bus bar includes a first recess recessed from a portion of the first bus bar that faces the third bus bar and that overlaps with the first detecting element in a thickness direction perpendicular to the arrangement direction. The second bus bar includes a second recess recessed from a portion of the second bus bar that faces the third bus bar and that overlaps with the second detecting element in the thickness direction. The third bus bar includes a third recess recessed from a portion of the third bus bar that faces the first recess and that overlaps with the third detecting element in the thickness direction and a fourth recess recessed from a portion of the third bus bar that faces the second recess and that overlaps with the third detecting element in the thickness direction.

A virtual plane on which the bus bars are projected in the thickness direction is defined as a projected plane. A direction perpendicular to both the arrangement direction and the thickness direction on the projected plane is defined as an extending direction. A straight line extending in parallel with the extending direction on the projected plane and passing through a center, in the arrangement direction, of a portion of the third bus bar that is neither the third recess nor the fourth recess is defined as a virtual line.

The first recess and the second recess have shapes on the projected plane that are symmetric with respect to the virtual line. The third recess and the fourth recess have shapes on the projected plane that are symmetric with respect to the virtual line.

DETAILED DESCRIPTION

Figure 1:
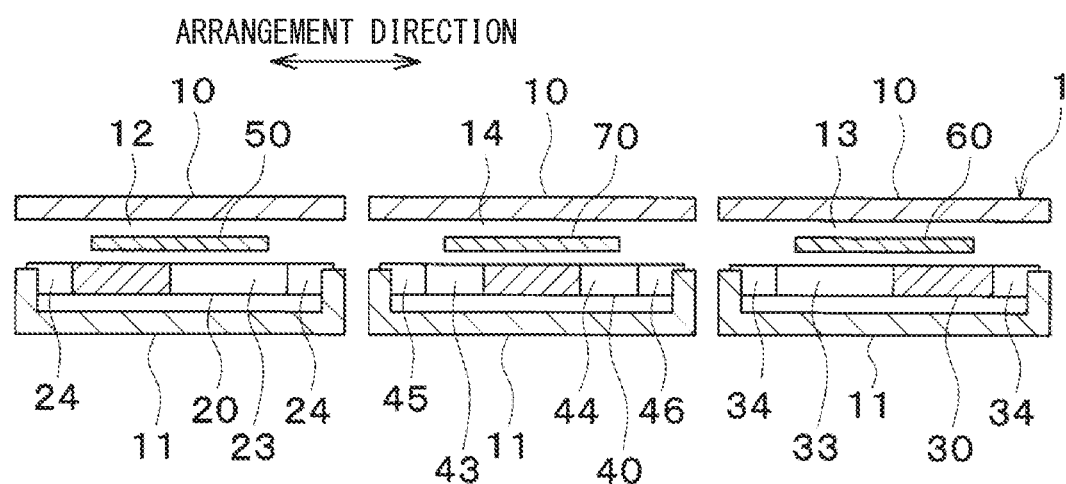
FIG. 1 is a cross-sectional view of a current sensor in a first embodiment.

To begin with, examples of relevant techniques will be described.

A current sensor is configured to detect an electric current flowing through three bus bars. Each of the bus bars is a wiring element having a liner shape elongated in a predetermined direction. The three bus bars are arranged in parallel with each other and three detectors configured to detect the electric current are disposed for the three bus bars.

Each of the bus bars includes a recess recessed from a portion of the bus bar that overlaps with the detector. The recesses of the bus bars have the same shapes and the same directions in which the bus bars are recessed. As a result, the portion of the bus bar that overlaps with the detector is distanced further from the adjacent bus bar than a portion of the bus bar that does not have the recess.

To reduce an influence of electromagnetic induction generated between the bus bars adjacent to each other, it is preferable that a distance between the detectors of the bus bars adjacent to each other be set to be long. In the above-described current sensor, the bus bars have the same shapes with each other. Thus, a distance between adjacent ones of the bus bars needs to be longer to lengthen the distance between adjacent ones of the detectors.

It is objective of the present disclosure to provide a current sensor that can reduce an electromagnetic induction generated between adjacent ones of bus bars.

A current sensor includes a first bus bar, a second bus bar, a third bus bar, a first detecting element, a second detecting element, and a third detecting element.

Each of the first bus bar, the second bus bar, and the third bus bar is elongated in a predetermined direction and is disposed in parallel with each other in an arrangement direction. An alternating current flows through the first bus bar, the second bus bar, and the third bus bar. The first detecting element is disposed for the first bus bar and configured to detect the alternating current flowing through the first bus bar. The second detecting element is disposed for the second bus bar and configured to detect the alternating current flowing through the second bus bar. The third detecting element is disposed for the third bus bar and configured to detect the alternating current flowing through the third bus bar.

The third bus bar is disposed between the first bus bar and the second bus bar. The first bus bar includes a first recess recessed from a portion of the first bus bar that faces the third bus bar and that overlaps with the first detecting element in a thickness direction perpendicular to the arrangement direction. The second bus bar includes a second recess recessed from a portion of the second bus bar that faces the third bus bar and that overlaps with the second detecting element in the thickness direction. The third bus bar includes a third recess recessed from a portion of the third bus bar that faces the first recess and that overlaps with the third detecting element in the thickness direction and a fourth recess recessed from a portion of the third bus bar that faces the second recess and that overlaps with the third detecting element in the thickness direction.

A virtual plane on which the bus bars are projected in the thickness direction is defined as a projected plane. A direction perpendicular to both the arrangement direction and the thickness direction on the projected plane is defined as an extending direction. A straight line extending in parallel with the extending direction on the projected plane and passing through a center, in the arrangement direction, of a portion of the third bus bar that is neither the third recess nor the fourth recess is defined as a virtual line.

The first recess and the second recess have shapes on the projected plane that are symmetric with respect to the virtual line. The third recess and the fourth recess have shapes on the projected plane that are symmetric with respect to the virtual line.

Since the first bus bar and the second bus bar are symmetric with respect to the virtual line and the third bus bar and the forth bus bar are symmetric with respect to the virtual line, a distance in the arrangement direction between a bottom of the third recess of the third bus bar and a bottom of the first recess of the first bus bar can be longer. Similarly, a distance in the arrangement direction between a bottom of the fourth recess of the third bus bar and a bottom of the second recess of the second bus bar can be longer. Therefore, an influence of electromagnetic induction induced between adjacent ones of the bus bars can be reduced.

Hereinafter, embodiments of the present disclosure will be described with reference to the drawings. In the following embodiments, the same reference numeral is given to the same or equivalent parts in the drawings.

First Embodiment

Hereinafter, a first embodiment will be described with reference to the drawings. A current sensor in this embodiment is used to detect three-phase alternating current supplied from an inverter to a motor or the like. The current sensor is integrally configured with bus bars.

Figure 2:
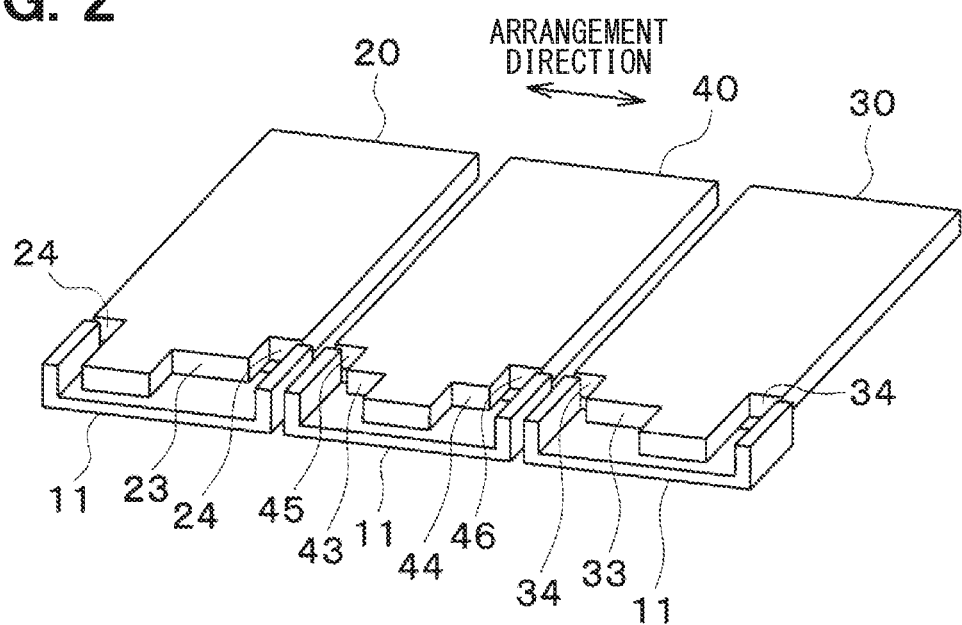
FIG. 2 is a partial perspective view of the current sensor in FIG. 1.
Figure 3:
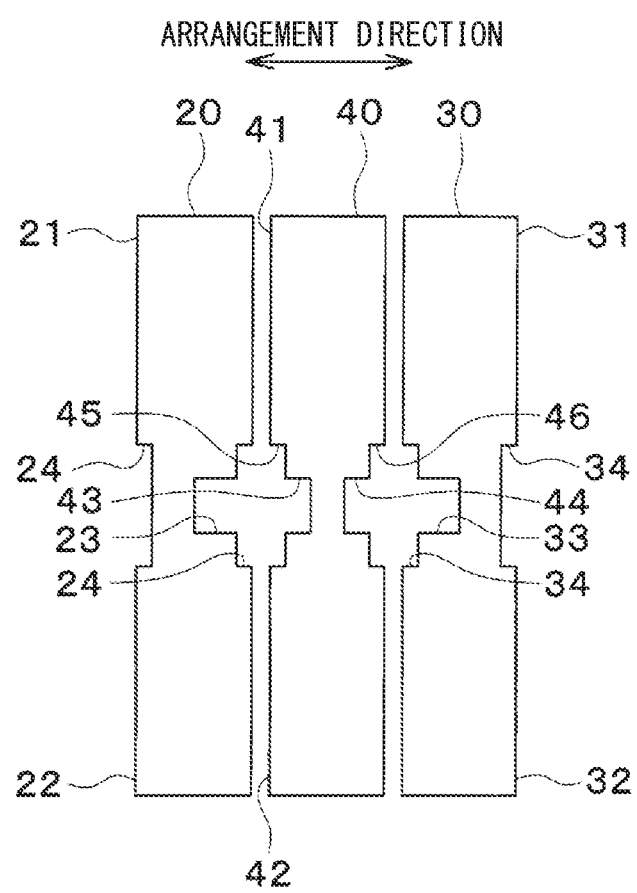
FIG. 3 is a plan view of bus bars.

Specifically, as shown in FIGS. 1, 2, and 3, the current sensor 1 includes shield plates 10 and 11, three bus bars 20, 30, and 40, and three detecting elements 50, 60, and 70.

The shield plates 10 and 11 are configured to shield magnetic fields generated by the three bus bars 20, 30 and 40 and external disturbance magnetic field. Each of the shield plates 10 and 11 is made of an electromagnetic steel plate. Each of the shield plates 10 and 11 may be made of one electromagnetic plate or may be made by stacking multiple electromagnetic steel plates.

A pair of the shield plate 10 and the shield plate 11 is disposed for each of the bus bars 20, 30, and 40. That is, three pairs of the shield plate 10 and the shield plate 11 are disposed. The shield plate 10 is formed into a flat plate shape. The shield plate 11 is formed by bending both ends of a plate member having a rectangular shape such that the both ends face with each other in parallel.

The shield plate 11 is disposed such that the both ends of the shield plate 11 face the shield plate 10. As a result, the pairs of the shield plate 10 and the shield plate 11 define housing spaces 12, 13, and 14. A part of the bus bar 20 and the detecting element 50 are housed in the housing space 12. A part of the bus bar 30 and the detecting element 60 are housed in the housing space 13. A part of the bus bar 40 and the detecting element 70 are housed in the housing space 14. The three pairs of the shield plates 10 and 11 are supported by a supporter such as a resin member (not shown). Thereby, the housing spaces 12, 13, and 14 are defined between the shield plate 10 and the shield plate 11.

Each of the bus bars 20, 30, and 40 is a conductor through which a three-phase alternating current flows and molded by pressing a plate material such as a copper plate. The bus bars 20, 30, and 40 are elongated in a predetermined direction. Currents having different phases flow respectively through the bus bars 20, 30, and 40.

The bus bars 20, 30, and 40 are arranged in parallel such that parts of the bus bars 20, 30, and 40 between one ends 21, 31, and 41 and the other ends 22, 32, and 42 are housed in the housing spaces 12 to 14. A direction in which the bus bars 20, 30, and 40 are arranged in parallel is defined as an arrangement direction. The one ends 21, 31, and 41 of the bus bars 20, 30, and 40 may be connected to an inverter. The other ends 22, 32, and 42 of the bus bars 20, 30, and 40 may be connected to a load such as a motor.

The three bus bars 20, 30, and 40 are respectively referred to as a first bus bar 20, a second bus bar 30, and a third bus bar 40. The third bus bar 40 is disposed between the first bus bar 20 and the second bus bar 30. The bus bars 20, 30, and 40 are disposed in parallel such that plate surfaces of the bus bars 20, 30, and 40 extend on the same plane. The bus bars 20, 30, and 40 are insert-molded into a resin to be prevented from being displaced and rotated.

The detecting elements 50, 60, and 70 are configured to detect alternating currents respectively flowing through the bus bars 20, 30, and 40. The detecting elements 50, 60, and 70 are disposed respectively for the first bus bar 20, the second bus bar 30, and the third bus bar 40. The detecting elements 50, 60, and 70 are located at an upper side of the bus bars 20, 30, and 40 in a thickness direction perpendicular to the arrangement direction in the housing spaces 12 to 14.

The detecting elements 50, 60, and 70 employ a magnetic detecting system using a magneto resistive element or a hall element. The detecting elements 50, 60, and 70 detect signal magnetic fields in a circumferential direction of the bus bars 20, 30, and 40 generated when an alternating current flows through the bus bars 20, 30, and 40. The detecting elements 50, 60, and 70 transmit signals proportional to strength of the signal magnetic fields.

The magneto resistive element may be Giant Magneto Resistance (i.e., GMR), Tunneling Magneto Resistance (i.e., TMR), or Anisotropic Magneto Resistance (i.e., AMR). The current sensor 1 in the present disclosure is configured as described above.

Next, shapes of the bus bars 20, 30, and 40 will be concretely described. As shown in FIGS. 2 and 3, a shape of a portion of the first bus bar 20 that overlaps with the first detecting element 50 in the thickness direction is different from shapes of the one end 21 of the first bus bar 20 and the other end 22 of the first bus bar 20. Similarly, a shape of a portion of the second bus bar 30 that overlaps with the second detecting element 60 in the thickness direction is different from shapes of the one end 31 of the second bus bar 30 and the other end 32 of the second bus bar 30. A shape of a portion of the third bus bar 40 that overlaps with the third detecting element 70 in the thickness direction is different from a shape of the one end 41 of the third bus bar 40 and a shape of the other end 42 of the third bus bar 40.

The first bus bar 20 includes a first recess 23 and first steps 24 at the portion of the first bus bar 20 that overlaps with the first detecting element 50 in the thickness direction. The first recess 23 is recessed from a portion of the first bus bar 20 that faces the third bus bar 40. The first steps 24 are portions of the first bus bar 20 into which the both ends, in the arrangement direction, of the shield plate 11 for the first bus bar 20 are disposed.

The second bus bar 30 includes a second recess 33 and second steps 34 at the portion of the second bus bar 30 that overlaps with the second detecting element 60 in the thickness direction. The second recess 33 recessed from a portion of the second bus bar 30 that faces the third bus bar 40. The second steps 34 are portions of the second bus bar 30 into which the both ends, in the arrangement direction, of the shield plate 11 for the second bus bar 30 are disposed.

The third bus bar 40 includes a third recess 43, a fourth recess 44, a third step 45, and a fourth step 46 at the portion of the third bus bur 40 that overlaps with the third detecting element 70 in the thickness direction. The third recess 43 is recessed from a portion of the third bus bar 40 that faces the first recess 23. The fourth recess 44 is recessed from a portion of the third bus bar 40 that faces the second recess 33. That is, the third bus bar 40 has a constricted shape.

The third step 45 is a portion of the third bus bar 40 into which one end, in the arrangement direction, of the shield plate 11 for the third bus bar 40 is disposed. The fourth step 46 is a portion of the third bus bar 40 into which the other end, in the arrangement direction, of the shield plate 11 for the third bus bar 40 is disposed.

Figure 4:
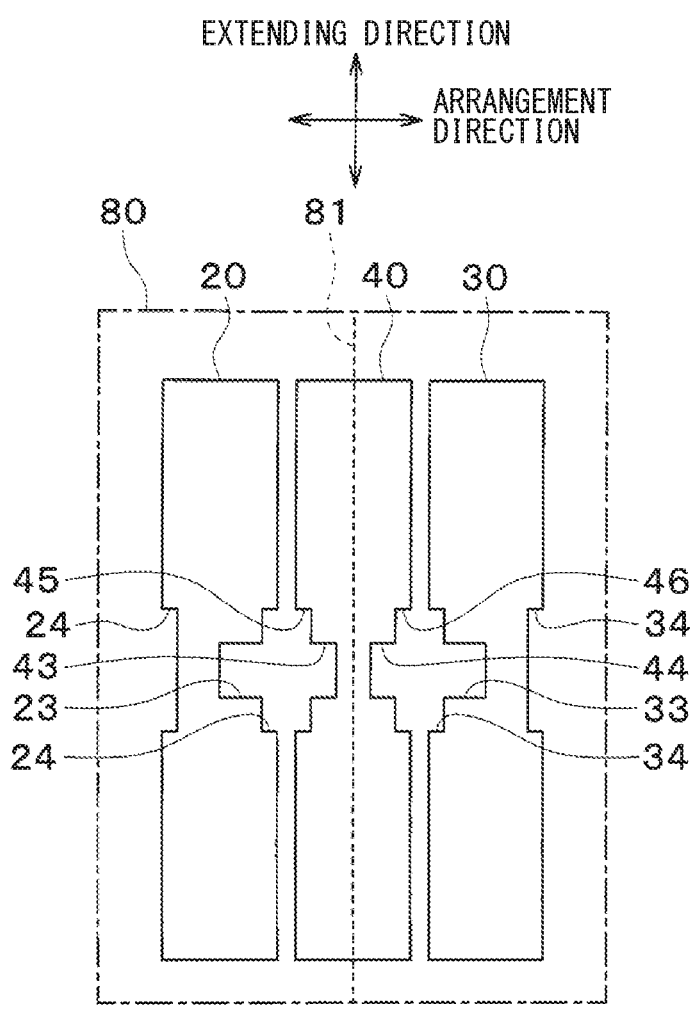
FIG. 4 is a schematic view illustrating a projected plane on which the bus bars are projected.

Next, as shown in FIG. 4, a virtual plane on which the bus bars 20, 30, and 40 are projected in the thickness direction is defined as a projected plane 80. The thickness direction is a vertical direction on a plane of paper in FIG. 4. A direction perpendicular to both the arrangement direction and the thickness direction on the projected plane 80 is defined as an extending direction.

A straight line extending in parallel with the extending direction on the projected plane 80 and passing through a center, in the arrangement direction, of a portion of the third bus bar 40 that is neither the third recess 43 nor the fourth recess 44 is defined as a virtual line 81.

Based on the above definitions, the first recess 23 of the first bus bar 20 and the second recess 33 of the second bus bar 30 have shapes on the projected plane 80 that are symmetric with respect to the virtual line 81. The third recess 43 and the fourth recess 44 of the third bus bar 40 have shapes on the projected plane 80 that are symmetric with respect to the virtual line 81.

In this embodiment, the first recess 23 has a shape projected on the projected plane 80 that is a same type as that of the second recess 33, and the third recess 43 has a shape projected on the projected plane 80 that is a same type as that of the fourth recess 44. Specifically, the shapes of the first recess 23 of the first bus bar 20 and the second recess 33 of the second bus bar 30 on the projected plane 80 are rectangular. Similarly, the shapes of the third recess 43 and the fourth recess 44 of the third bus bar 40 on the projected plane 80 are rectangular.

The first steps 24 and the second steps 34 may have shapes that are symmetric with respect to the virtual line 81 or not. Similarly, the third step 45 and the fourth step 46 may have shapes that are symmetric with respect to the virtual line 81 or not.

The first recess 23 and the second recess 33 have depths that are a same with depths of the third recess 43 and the fourth recess 44. The depth of the bas bar is a distance, in the arrangement direction on the projected plane 80, between an end of the bus bar facing the adjacent bus bar and a bottom of the recess that is the deepest in the arrangement direction. For example, the depth of the first recess 23 is a distance in the arrangement direction between an end of the first bus bar 20 facing the third bus bar 40 and a bottom of the first recess 23 that is the deepest in the arrangement direction.

Because of the shapes of the bus bars 20, 30, and 40, the bottom of the third recess 43 can be located closer to the virtual line 81 and the bottom of the first recess 23 can be located away from the third bus bar 40. Thus, a distance between the bottom of the third recess 43 of the third bus bar 40 and the bottom of the first recess 23 of the first bus bar 20 is secured to be long. Similarly, a distance between the bottom of the fourth recess 44 of the third bus bar 40 and the bottom of the second recess 33 of the second bus bar 30 is secured to be long. Therefore, an influence of electromagnetic induction induced between adjacent ones of the bus bars 20, 30, and 40 can be reduced.

In addition, it is not necessary to secure a wide distance between adjacent ones of the bus bars 20, 30, and 40. That is, it is not necessary to change a length in the arrangement direction between an end of the first bus bar 20 facing away from the third bus bar 40 and an end of the second bus bar 30 facing away from the third bus bar 40. Therefore, the current sensor 1 is restricted from increasing in entire size.

Figure 5:
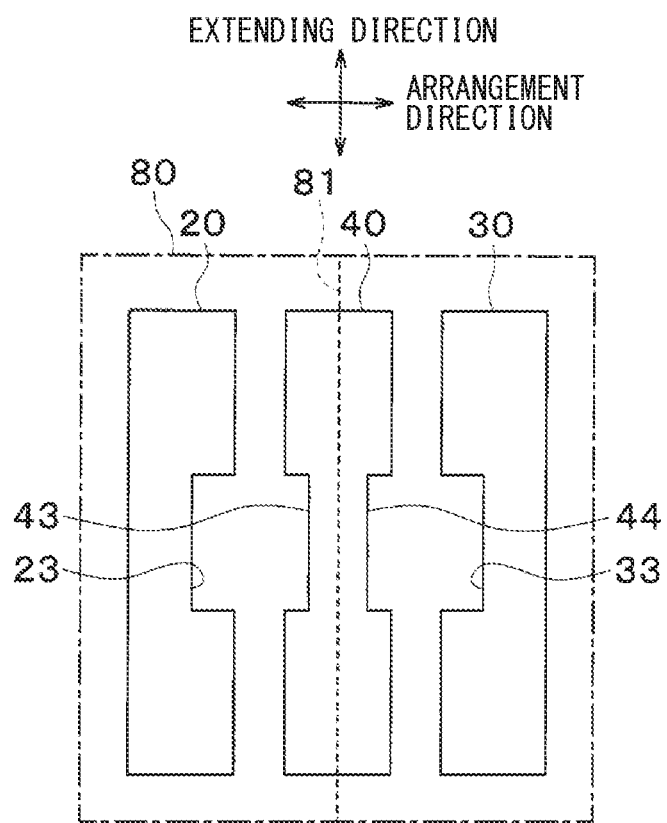
FIG. 5 is a schematic view illustrating a projected plane on which bus bars in another example of the first embodiment are projected.

In a modified example, as shown in FIG. 5, each of the bus bars 20, 30, and 40 does not necessarily include steps 24, 34, 45, and 46. The recesses 23, 33, 43, and 44 may have the same type of shapes or may be different at depths.

Figure 6:
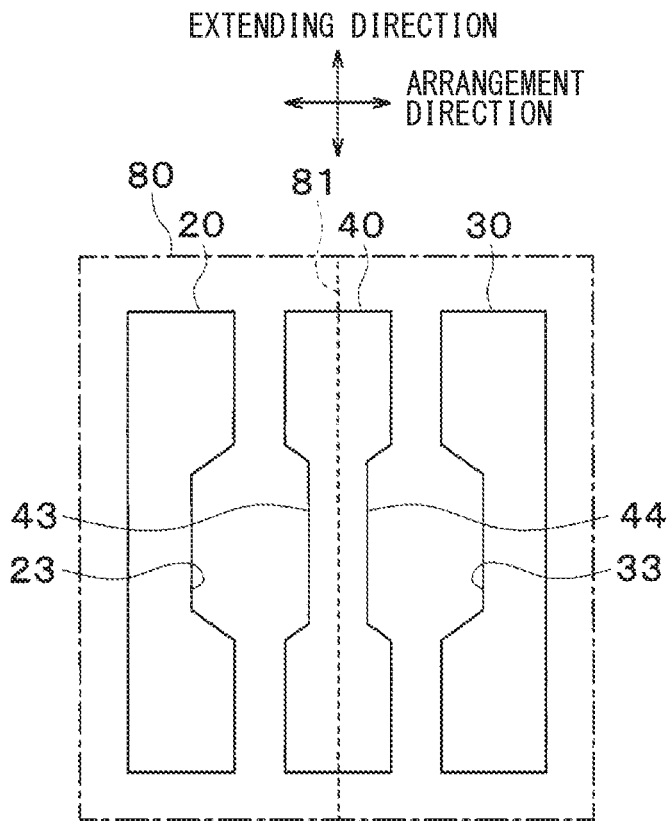
FIG. 6 is a schematic view illustrating a projected plane on which bus bars in another example of the first embodiment are projected.

In a modified example, as shown in FIG. 6, the first recess 23 of the first bus bar 20 and the second recess 33 of the second bus bar 30 may have trapezoidal shapes on the projected plane 80. Similarly, the third recess 43 and the fourth recess 44 of the third bus bar 40 may have trapezoidal shapes on the projected plane 80.

Figure 7:
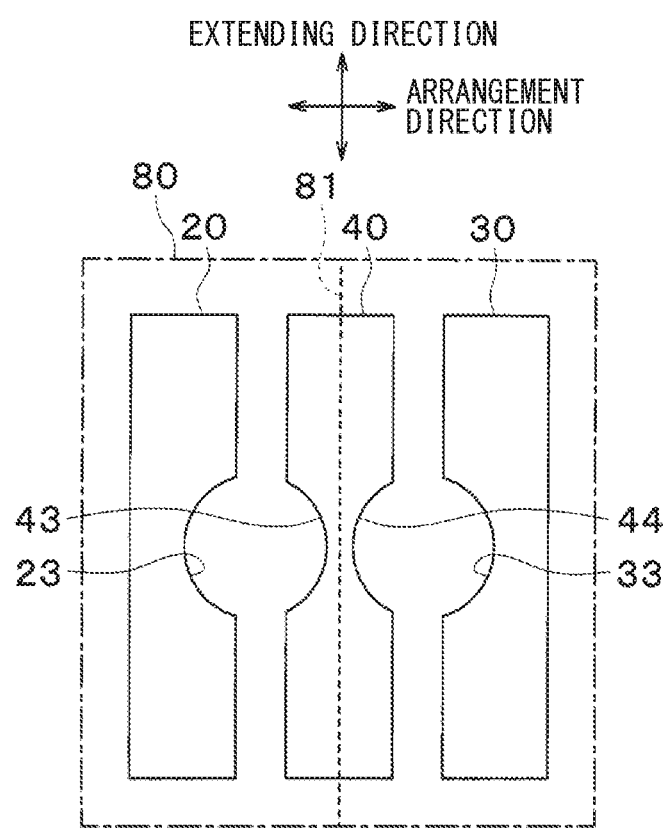
FIG. 7 is a schematic view illustrating a projected plane on which bus bars in another example of the first embodiment are projected.

In a modified example, as shown in FIG. 7, the first recess 23 of the first bus bar 20 and the second recess 33 of the second bus bar 30 may have circular shapes on the projected plane 80. Similarly, the third recess 43 and the fourth recess 44 of the third bus bar 40 may have circular shapes on the projected plane 80. The circular shape means a partial circular arc. The circular shape includes not only a partial true circular arc but also a partial elliptical arc and a partial arbitrary curve.

Figure 8:
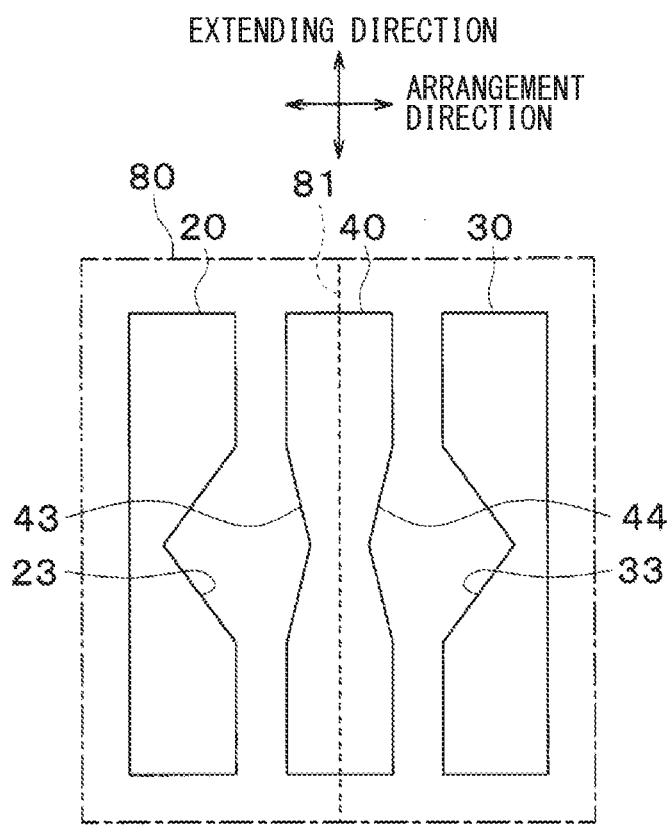
FIG. 8 is a schematic view illustrating a projected plane on which bus bars in another example of the first embodiment are projected.

In a modified example, as shown in FIG. 8, the first recess 23 of the first bus bar 20 and the second recess 33 of the second bus bar 30 may have triangular shapes on the projected plane 80. Similarly, the third recess 43 and the fourth recess 44 of the third bus bar 30 may have triangular shapes on the projected plane 80.

Figure 9:
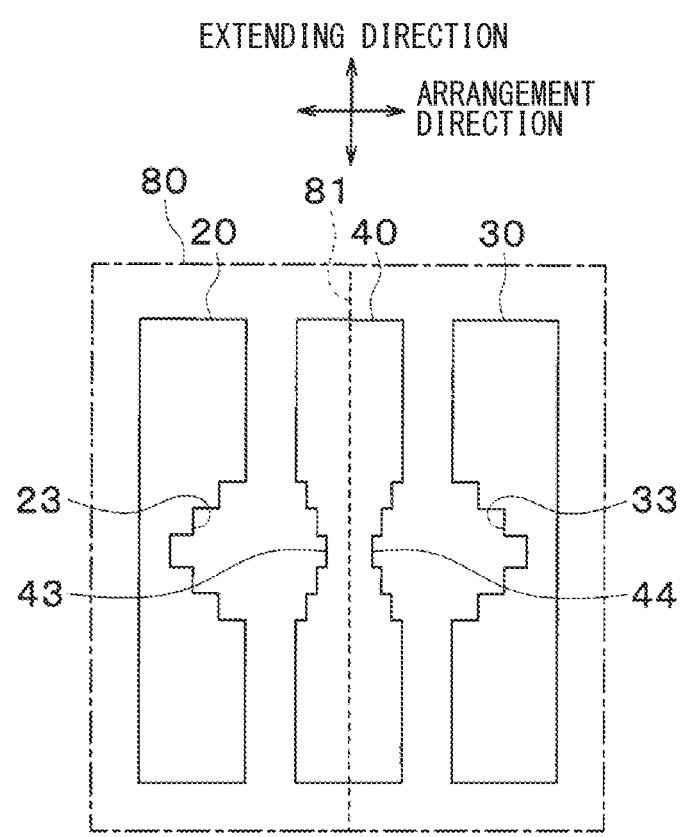
FIG. 9 is a schematic view illustrating a projected plane on which bus bars in another example of the first embodiment are projected.

In a modified example, as shown in FIG. 9, the first recess 23 of the first bus bar 20 and the second recess 33 of the second bus bar 30 may have stepped shapes on the projected plane 80. Similarly, the third recess 43 and the fourth recess 44 of the third bus bar 40 may have stepped shapes on the projected plane 80. The shapes of the recesses 23, 33, 43, and 44 may be any shapes while the recess 23 and the recess 33 are symmetric with respect to the virtual line 81 and the recess 43 and the recess 44 are symmetric with respect to the virtual line 81.

Figure 10:
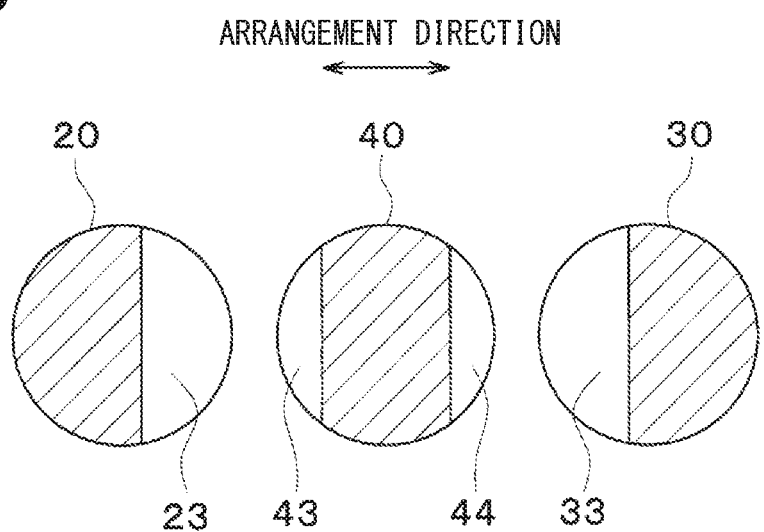
FIG. 10 is a cross-sectional view of bus bars in another example of the first embodiment.

In a modified example, as shown in FIG. 10, each of the bus bars 20, 30, and 40 may be formed into a cylindrical shape instead of a flat plate shape. The shape of each of the bus bars 20, 30, and 40 is understandably not limited to the cylindrical shape and may be an elliptic pillar or a polygonal pillar such as a square pillar. Each of the bus bars 20, 30, and 40 may have a pillar shape while the recess 23 and the recess 33 are symmetric on the projected plane 80 with respect to the virtual line 81 and the recess 43 and the recess 44 are symmetric on the projected plane 80 with respect to the virtual line 81.

Second Embodiment

Figure 11:
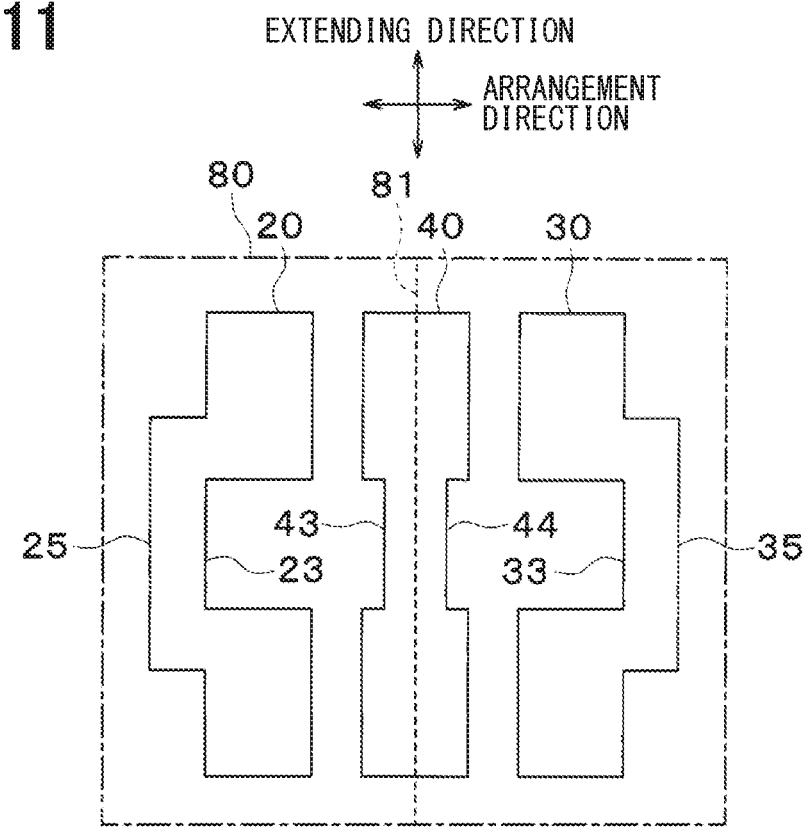
FIG. 11 is a schematic view of a projected plane on which bus bars in a second embodiment are projected.

A second embodiment will be described mainly at different points from the first embodiment. As shown in FIG. 11, the first bus bar 20 includes a first protrusion 25. The first protrusion 25 protrudes away from the third bus bar 20 from a portion of the first bus bar 20 facing away from the third bus bar 40. The portion of the first bus bar 20 corresponds to and overlaps with the first detecting element 50 in the thickness direction. The first protrusion 25 forms the bottom of the first recess 23 of the first bus bar 20.

Similarly, the second bus bar includes a second protrusion 35. The second protrusion 35 protrudes away from the third bus bar 40 from a portion of the second bus bar 30 facing away from the third bus bar 40. The portion of the second bus bar 30 corresponds to and overlaps with the second detecting element 60 in the thickness direction. The second protrusion 35 forms the bottom of the second recess 33 of the second bus bar 30.

Because of the above-described configuration, a length in the arrangement direction between a top end of the first protrusion 25 and a top end of the second protrusion 35 can be longer compared to a configuration without the protrusions 25 and 35. In addition, the first recess 23 and the second recess 33 can have depths deeper than those of the third recess 43 and the fourth recess 44. Thus, an influence of electromagnetic induction is further reduced.

Third Embodiment

Figure 12:
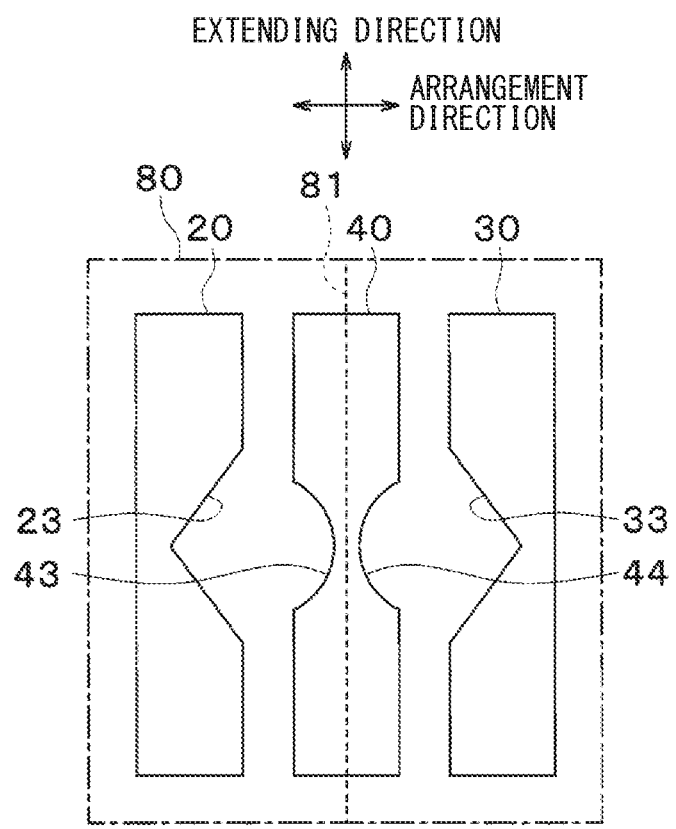
FIG. 12 is a schematic view of a projected plane on which bus bars in a third embodiment are projected.

A third embodiment will be described mainly at different points from the first embodiment. As shown in FIG. 12, a type of the shapes of the first recess 23 and the second recess 33 projected on the projected plane 80 is different from a type of the shapes of the third recess 43 and the fourth recess 44 projected on the projected plane 80. Specifically, the shapes of the first recess 23 and the second recess 33 projected on the projected plane 80 are triangular shapes. In contrast, the shapes of the third recess 43 and the fourth recess 44 are circular shapes. Therefore, the same advantages in the first embodiment can be obtained.

In a modified example, the shapes of the first recess 23 and the second recess 33 projected on the projected plane 80 may be circular shapes and the shapes of the third recess 43 and the fourth recess 44 may be triangular shapes. For example, the type of shapes of the first recess 23 and the second recess 33 and the type of shapes of the third recess 43 and the fourth recess 44 may be appropriately selected between a triangle, a circle, a rectangular, a trapezoid, a stepper shape, and an arbitrary shape.

Figure 13:
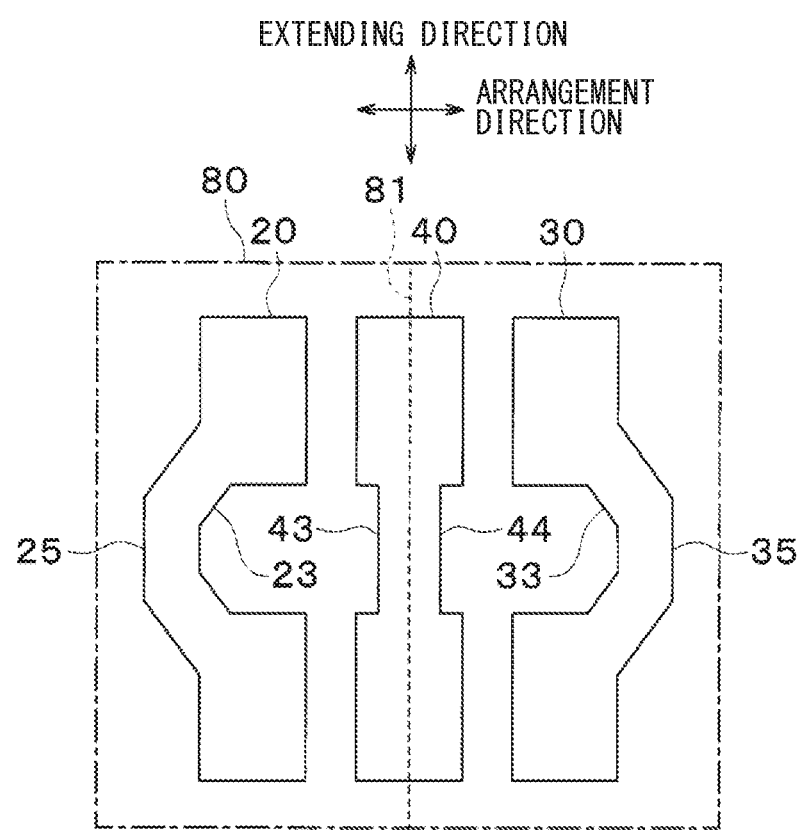
FIG. 13 is a schematic view of a projected plane on which bus bars in another example of the third embodiment are projected.

In a modified example, as shown in FIG. 13, the first bus bar 20 may include the first protrusion 25 and the second bus bar 30 may include the second protrusion 35. The type of shapes of the first recess 23 and the second recess 33 projected on the projected plane 80 may be an arbitrary shape and the type of shapes of the third recess 43 and the fourth recess 44 may be a rectangular.

Other Embodiments

The configurations of the current sensor 1 in the above-described embodiments are merely examples and the configuration of the current sensor 1 is not limited to the above-described configurations and may be other configurations capable of realizing the present disclosure. For example, shapes of outer edges of the protrusions 25 and 35 may be curved shapes instead of angled shapes.

The first recess 23 and the second recess 33 may have maximum lengths in the extending direction that are different from those of the third recess 43 and the fourth recess 44. For example, in a length of a bottom of a triangular shape in FIG. 8 (i.e., a maximum length of a triangular shape in the extending direction), lengths in the extending direction of a bottom of the first recess 23 and a bottom the second recess 33 may be longer than lengths in the extending direction of a bottom of the third recess 43 and a bottom of the fourth recess 44.

What is claimed is:

1. A current sensor comprising:
a first bus bar, a second bus bar, and a third bus bar each of which is elongated in a predetermined direction and is arranged in parallel with each other in an arrangement direction, alternating current flowing through the first bus bar, the second bus bar, and the third bus bar;
a first detecting element that is configured to detect the alternating current flowing through the first bus bar;
a second detecting element that is configured to detect the alternating current flowing through the second bus bar; and
a third detecting element that is configured to detect the alternating current flowing through the third bus bar, wherein
the third bus bar is disposed between the first bus bar and the second bus bar,
the first bus bar includes a first recess recessed from a portion of the first bus bar that faces the third bus bar and that overlaps with the first detecting element in a thickness direction perpendicular to the arrangement direction,
the second bus bar includes a second recess recessed from a portion of the second bus bar that faces the third bus bar and that overlaps with the second detecting element in the thickness direction,
the third bus bar includes:
a third recess recessed from a portion of the third bus bar that faces the first recess and that overlaps with the third detecting element in the thickness direction; and a fourth recess recessed from a portion of the third bus bar that faces the second recess and overlaps with the third detecting element in the thickness direction, a virtual plane on which the first bus bar, the second bus bar, and the third bus bar are projected in the thickness direction is defined as a projected plane, a direction perpendicular to both the arrangement direction and the thickness direction on the projected plane is defined as an extending direction, a straight line extending in parallel with the extending direction on the projected plane and passing through a center, in the arrangement direction, of a portion of the third bus bar that is neither the third recess nor the fourth recess is defined as a virtual line, the first recess and the second recess have shapes on the projected plane that are symmetric with respect to the virtual line, and the third recess and the fourth recess have shapes on the projected plane that are symmetric with respect to the virtual line.

2. The current sensor according to claim 1, wherein
the first bus bar includes a first protrusion that protrudes away from the third bus bar from a portion of the first bus bar facing away from the third bus bar, the portion of the first bus bar overlapping with the first detecting element in the thickness direction, and the second bus bar includes a second protrusion that protrudes away from the third bus bar from a portion of the second bus bar facing away from the third bus bar, the portion of the second protrusion overlapping with the second detecting element in the thickness direction.

3. The current sensor according to claim 1, wherein
the first recess has a shape projected on the projected plane that is a same type as that of the second recess, and the third recess has a shape projected on the projected plane that is a same type as that of the fourth recess.

4. The current sensor according to claim 3, wherein
the type of the shapes of the first recess and the second recess on the projected plane is a rectangular, and the type of the shapes of the third recess and the fourth recess on the projected plane is a rectangular.

5. The current sensor according to claim 3, wherein
the type of the shapes of the first recess and the second recess on the projected plane is a trapezoid, and the type of the shapes of the third recess and the fourth recess on the projected plane is a trapezoid.

6. The current sensor according to claim 1, wherein
a type of the shapes of the first recess and the second recess projected on the projected plane is different from a type of the shapes of the third recess and the fourth recess projected on the projected plane.

\* \* \* \* \*